United States Patent [19]

Ogihara

[11] Patent Number: 5,303,193
[45] Date of Patent: Apr. 12, 1994

[54] SEMICONDUCTOR DEVICE

[75] Inventor: Masaki Ogihara, Yokohama, Japan

[73] Assignee: Kabushiki Kaisha Toshiba, Kawasaki, Japan

[21] Appl. No.: 813,580

[22] Filed: Dec. 26, 1991

[30] Foreign Application Priority Data

Dec. 27, 1990 [JP] Japan ................... 2-418753

[51] Int. Cl.⁵ ............................................ G11C 7/00
[52] U.S. Cl. ....................... 365/201; 365/238.5
[58] Field of Search ............... 365/201, 238.5, 230.06, 365/175

[56] References Cited

U.S. PATENT DOCUMENTS

| | | | |
|---|---|---|---|
| 4,595,875 | 6/1986 | Chan | 365/201 |
| 4,608,666 | 8/1986 | Uchida | 365/222 |
| 4,737,936 | 4/1988 | Takeuchi | 365/201 |
| 4,751,679 | 6/1988 | Dehganpour | 365/230.01 |
| 4,860,261 | 8/1989 | Kreifels | 365/201 |
| 4,920,515 | 4/1990 | Obata | 365/201 |
| 4,969,124 | 11/1990 | Luich | 365/201 |
| 5,155,701 | 10/1992 | Komri | 365/201 |

*Primary Examiner*—Eugene R. LaRoche
*Assistant Examiner*—A. Zarabian
*Attorney, Agent, or Firm*—Banner, Birch, McKie & Beckett

[57] ABSTRACT

According to this invention, a semiconductor device includes a plurality of MOS transistors arranged in a matrix form, common wiring lines connected to MOS transistors of the same row or the same column, diodes each having one end connected to a corresponding one of the common wiring lines of each row or column, and a voltage applying circuit for controlling the potential of other terminal of each of the diodes and simultaneously applying a predetermined voltage to all the common wiring lines or arbitrary common wiring lines having the number larger than the number of wiring lines selected during a normal operation.

21 Claims, 11 Drawing Sheets

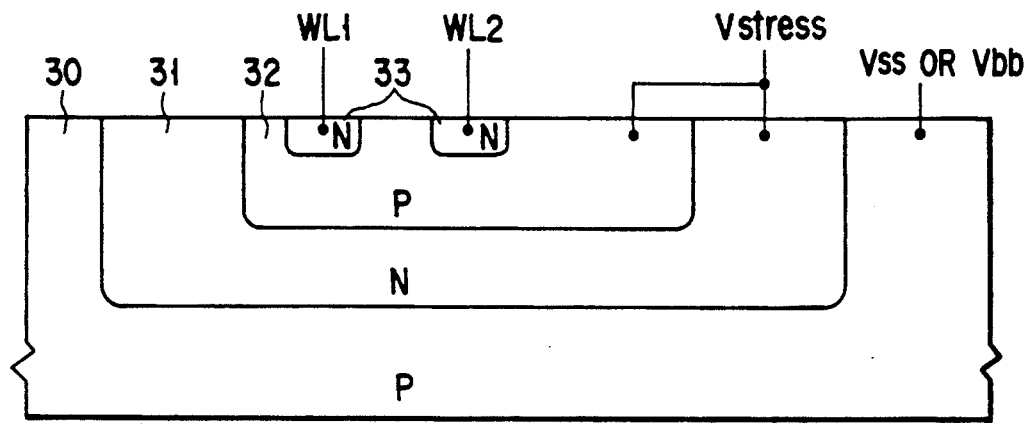
F I G. 2A
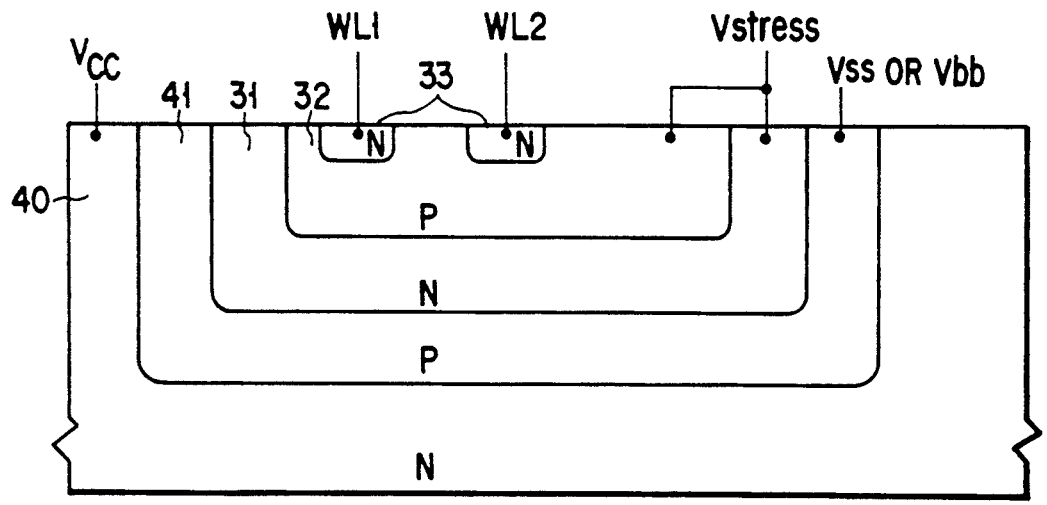
F I G. 2B

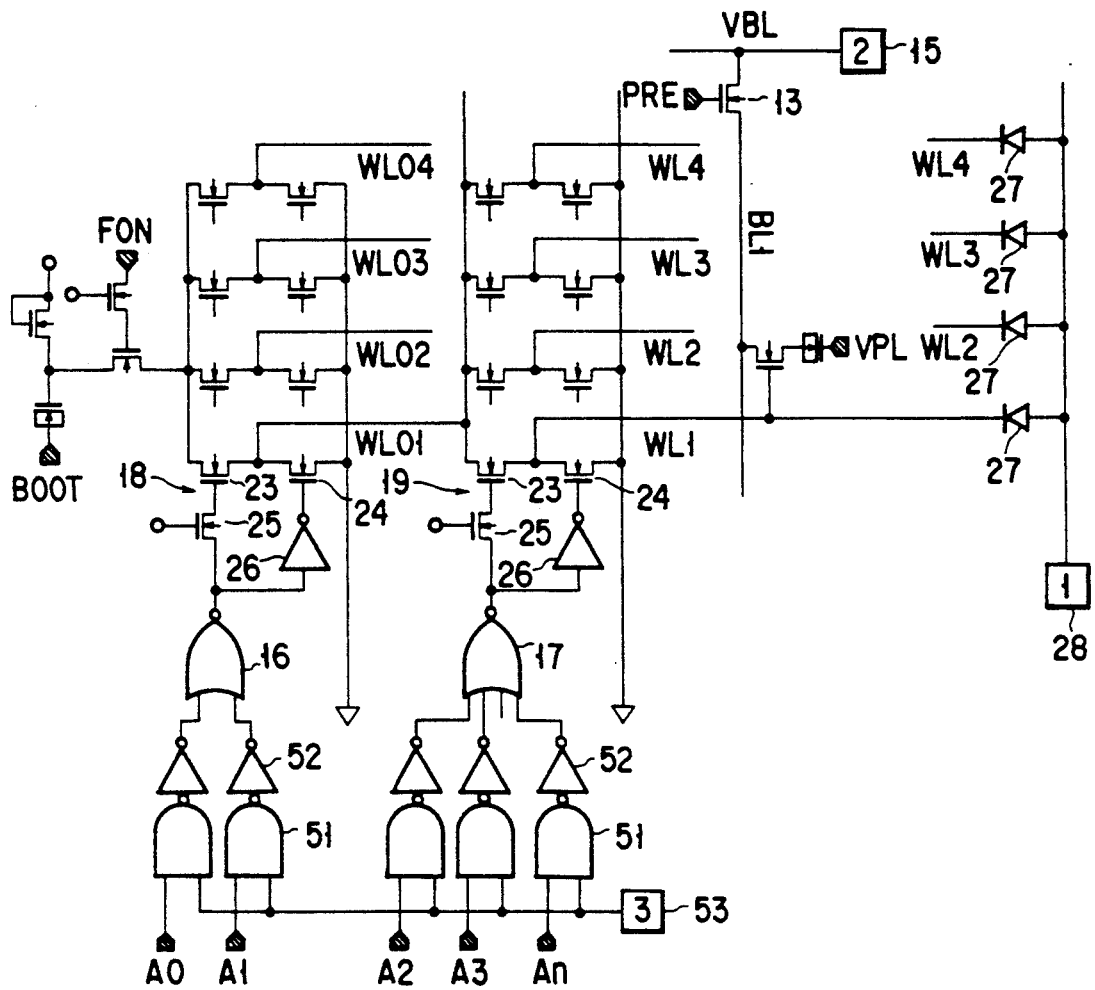
F I G. 3

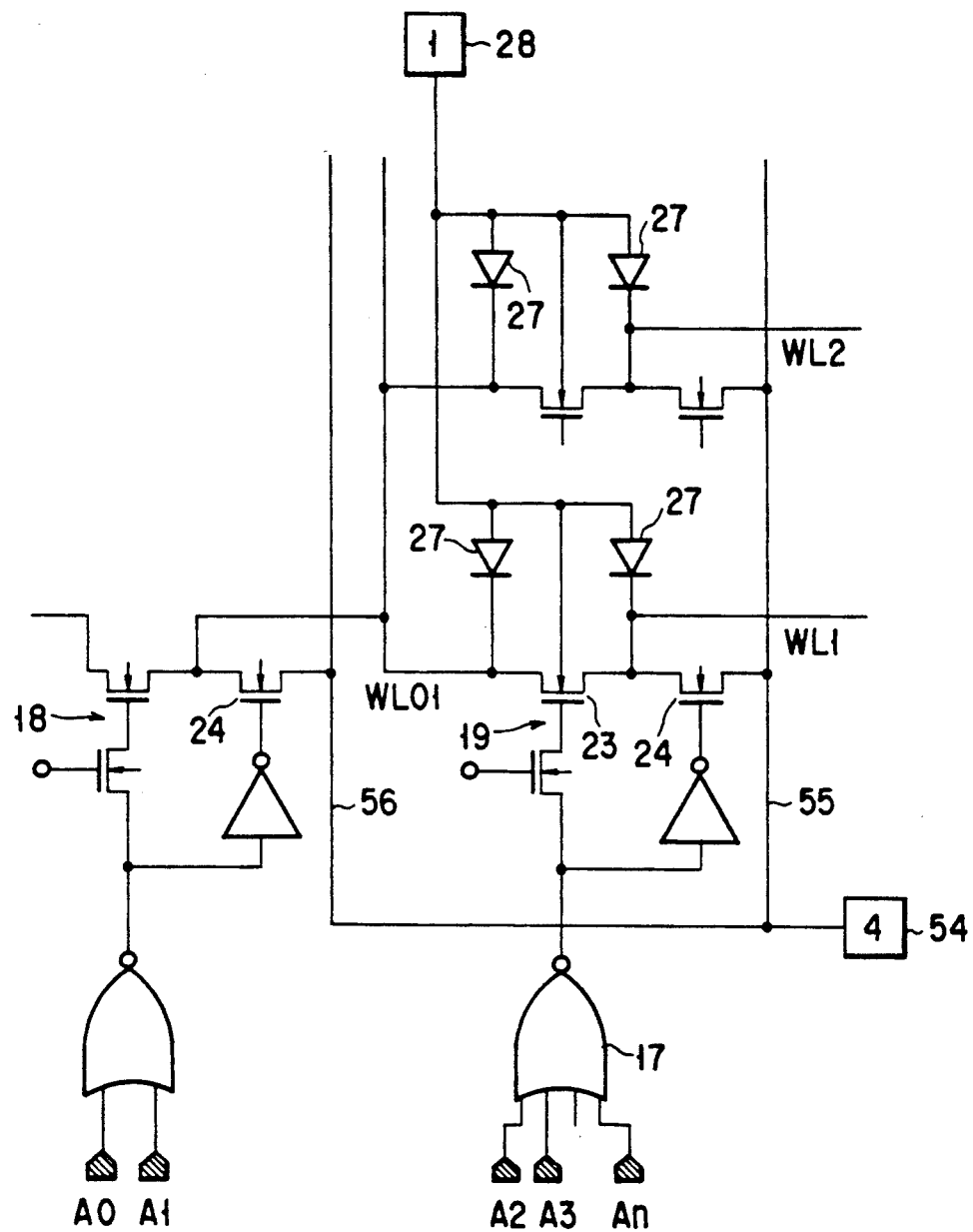
F I G. 9

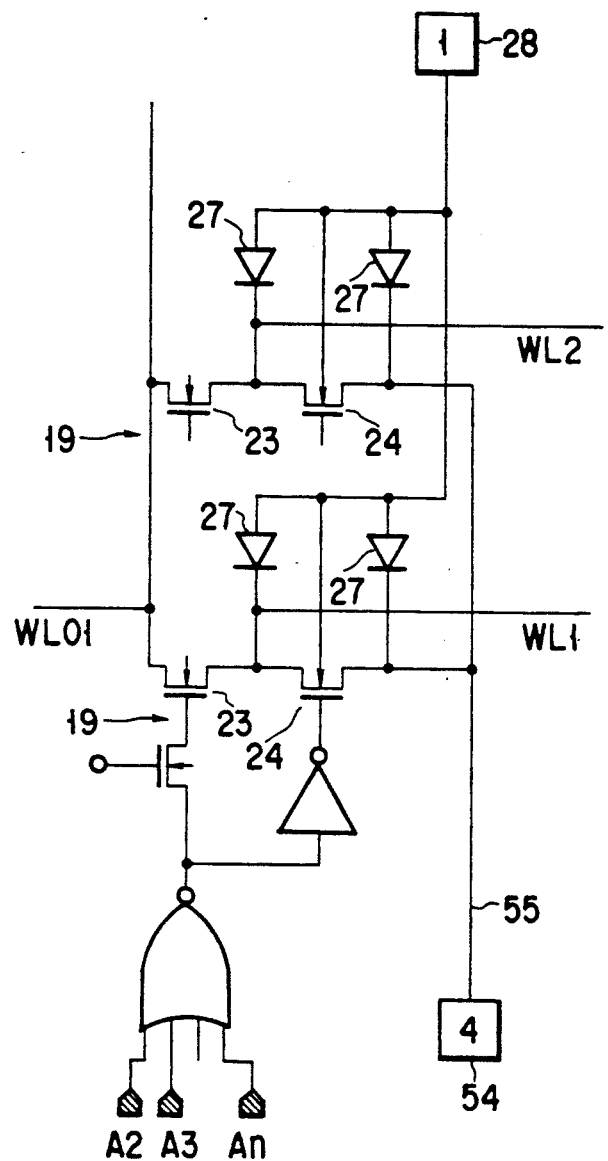
F I G. 10

SEMICONDUCTOR DEVICE

BACKGROUND OF THE INVENTION

1. Field of the Invention

The present invention relates to a semiconductor device and, more particularly, to a semiconductor device having a stress testing device for applying a voltage stress, e.g., when defect screening is performed in a wafer state.

2. Description of the Related Art

When semiconductor devices are to be shipped, in order to obtain the reliability of the semiconductor devices, screening for exposing potential defects of the devices and for removing defective devices is generally performed to prevent the non-defective devices from degradation and from being defective. As a method of performing the screening, a burn-in method capable of simultaneously achieving electric field acceleration and temperature acceleration is often used. According to this burn-in method, when devices are operated at a voltage higher than a rated voltage and a temperature higher than a rated temperature, since a stress received in an initial failure period or more under rated conditions acts on the devices for a short time, devices which may cause an initial operative failure are screened in advance before the devices are shipped. Therefore, the devices which may cause an initial operative failure can be efficiently removed, and the reliability of the products can be increased.

When defective DRAMs (Dynamic Random Access Memories) are to be screened, a method of scanning word lines in an order of addresses and sequentially accessing the word lines is conventionally used. In this case, when a transfer gate transistor (cell transistor) of a memory cell having a gate connected to a word line is considered, a voltage stress is applied to the transistor in a frequency lower than that of a transistor of a peripheral circuit. For example, when a DRAM having a memory capacity of 4 Mbits is exemplified, only 4 word lines of the 4069 word lines of the DRAM are selected in one cycle, and a test for a cell transistor is completed in 1024 cycles. For this reason, the gate of the cell transistor receives a voltage stress for a 1/1024 period of the transistor of the peripheral circuit. Therefore, since a substantial period of applying a maximum electric field to the gate is short, a long time is required for screening defects.

In a DRAM used in recent years, a half (Vcc/2) of a power supply potential Vcc is generally applied to the electrode of a capacitor of a memory cell. For this reason, even when a thin film is used as the insulating film of the capacitor, since an electric field applied to the film is decreased, the reliability of the DRAM is rarely degraded. In contrast to this, since the gate oxide film of a memory cell transistor receives a potential (e.g., about 1.5×Vcc) boosted during selection of the cell transistor, even when the oxide film having a large thickness is used, an intensive electric field is applied to the oxide film. As a result, the reliability of the memory cell transistor is often degraded. When defective DRAMs are to be screened, especially, a cell transistor having the gate receiving a boosted potential is positively subjected to screening.

As described above, a memory cell transistor which is to be positively screened receives a voltage stress in a low frequency. In order to solve this problem, a semiconductor memory as disclosed in Published Unexamined Japanese Patent Application (Kokai) No. 3-35491 T. FURUYAMA includes a voltage stress is simultaneously applied to all word lines or word lines having a number equal to or larger than the number of word lines selected during a normal operation, thereby increasing the efficiency of applying a stress to a cell transistor.

According to this proposal, when screening of DRAMs set in a wafer state is performed using a prober and a probe card, defects are set at a level such that all defective cell transistors in each chip region are sufficiently screened, and all bit defects as major defects of a 1-M DRAM or a 4-M DRAM can be screened at a high speed. Therefore, efficiency of defect screening can be considerably increased.

The number of inputs required for a voltage stress test is preferably decreased, and it is preferable that a voltage stress can be simultaneously applied to MOS transistors of the same row (or column) in a semiconductor device having a plurality of MOS transistors arranged in a matrix form. The semiconductor device is not limited to a semiconductor memory.

SUMMARY OF THE INVENTION

The present invention has been made in consideration of the above situation, and has as its object to provide a semiconductor device capable of simultaneously applying a voltage stress to MOS transistors of the same row (or column) of a plurality of MOS transistors arranged in a matrix form by using a small number of inputs for a voltage stress test, thereby increasing a stress acceleration efficiency for the MOS transistors.

In order to achieve the above object, according to the present invention, there is provided a semiconductor device comprising a plurality of MOS transistors arranged in a matrix form, common wiring lines commonly connected to one terminal (drain or source) or a gate of each of the MOS transistors of the same row or the same column, diodes each having one terminal connected to a corresponding one of common wiring lines of each row or column, and voltage applying circuit for controlling a potential of the other terminal of each of the diodes and simultaneously applying a predetermined voltage to all the common wiring lines or an arbitrary number of common wiring lines having the number not less than the number of wiring lines selected during a normal operation.

According to the present invention, there is provided a semiconductor device comprising a plurality of memory cells arranged in a matrix form, word lines connected to memory cells of the same row, bit lines connected to memory cells of the same column, word line driving circuits connected to the word lines, diodes each having one terminal connected to a corresponding one of the word lines, and voltage applying circuit for controlling a potential of the other terminal of each of the diodes and simultaneously applying a predetermined voltage to all the word lines or an arbitrary number of word lines having the number not less than the number of word lines selected during a normal operation.

Each diode is arranged independently of the word line driving circuit, and a junction between the substrate and an impurity-diffusion region of a word line driving transistor of the word line driving circuit or a noise killer transistor can be used as each diode.

In this semiconductor device, a predetermined voltage can be simultaneously applied to all common wiring lines (or an arbitrary number of wiring lines having the number larger than the number of wiring lines selected during a normal operation) by controlling the potential of the other terminal of each of the diodes, and a stress acceleration efficiency for MOS transistors can be increased. In this case, a small number of inputs are required for controlling the potential of the other terminal of each of the diodes.

In a voltage stress test for a semiconductor memory, a predetermined voltage can be simultaneously applied to all word lines (or an arbitrary number of word lines having the number larger than the number of word lines selected during a normal operation). Therefore, when an AC or DC voltage is applied to word lines, screening can be performed by a smaller number of cycles than the number of normal cycles.

In this case, when a junction between the substrate and the impurity-diffusion region of a word line driving transistor of the word line driving circuit or a noise killer transistor is used as the diode, a predetermined voltage stress can be simultaneously applied to word lines from the word line driving circuits.

The diode is arranged independently of the word line driving circuit, and the cathode of the diode is connected to, e.g., the other end of the word line (the end opposite to an end connected to a word line driving transistor). At this time, when the potential of the anode electrode of the diode is controlled, a predetermined voltage stress can be simultaneously applied to the word lines.

Note that it is further effective that a circuit for applying a predetermined voltage to each bit line is arranged. When a DRAM is used as the semiconductor memory, a screening efficiency can be considerably increased while a demand unique to a DRAM is satisfied, i.e., a cell transistor having the gate receiving a boosted potential is positively subjected to screening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2D are sectional views respectively showing different arrangements of a diode in FIG. 1;

FIG. 3 is a circuit diagram showing a part of a DRAM according to the second embodiment of the present invention;

FIG. 9 is a circuit diagram showing a part of a DRAM according to the eighth embodiment of the present invention; and FIG. 10 is a circuit diagram showing a part of a DRAM according to the ninth embodiment of the present invention.

DETAILED DESCRIPTION OF THE PREFERRED EMBODIMENTS

Figure 1:
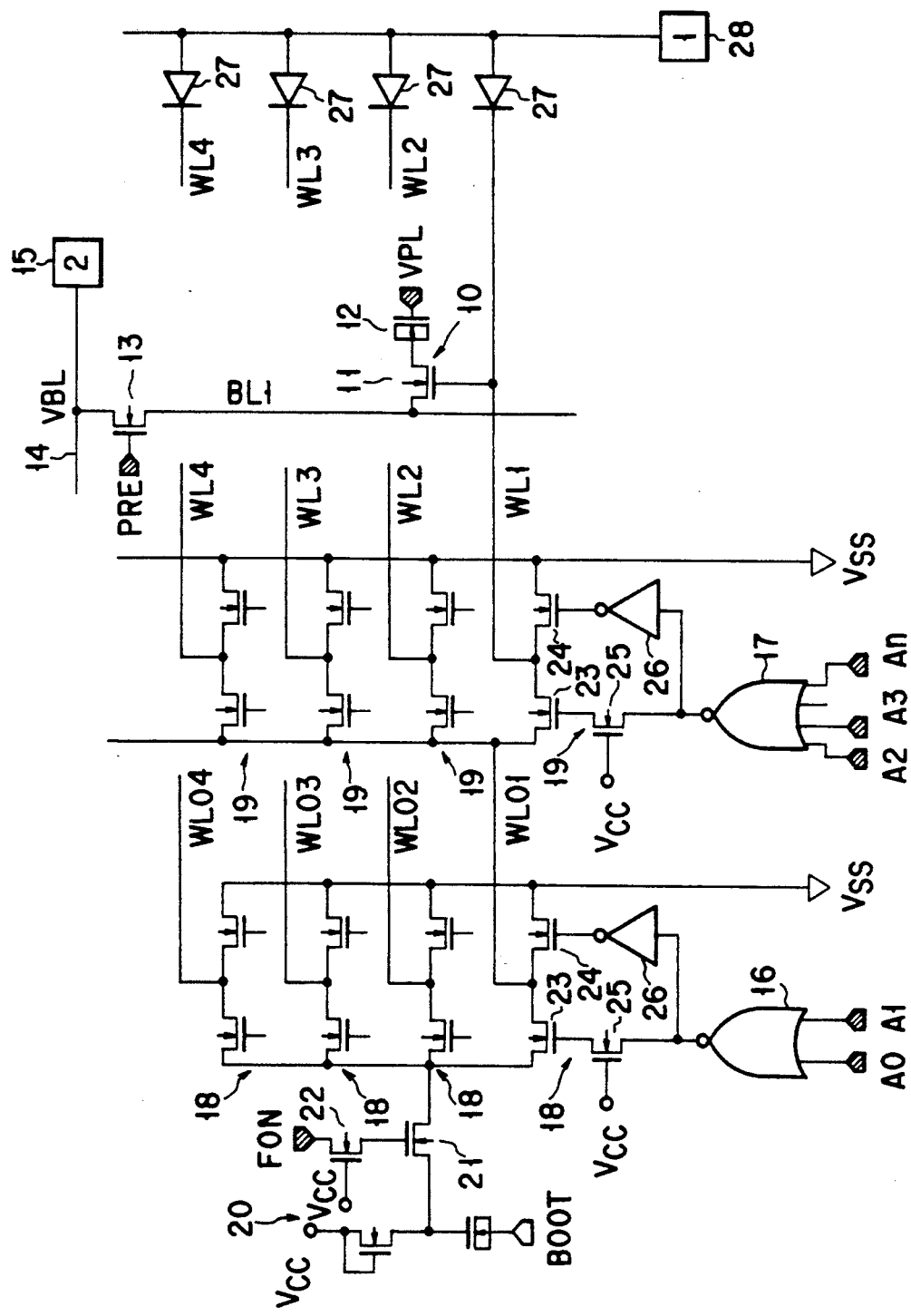
FIG. 1 is a circuit diagram showing a part of a DRAM according to the first embodiment of the present invention.

Several embodiments of semiconductor devices according to the present invention will be described below with reference to the accompanying drawings. In the following description, the same reference numerals denote the same parts throughout the drawings, and a repetitive explanation will be omitted.

FIG. 1 is a circuit diagram showing a part of a DRAM according to the first embodiment of the present invention.

In this DRAM, the present invention is applied to the other end of a word line opposite to its one end connected to a driving circuit for selecting the word line of a memory cell.

Reference numeral 10 denotes memory cells arranged in a matrix form (one of the memory cells is representatively indicated in FIG. 1), and reference numeral 11 denotes a transfer gate MOS transistor (cell transistor) of each memory cell. The gates of the cell transistors 11 of the same row are connected to a word line (e.g., WL1), and the drains of the cell transistors of the same column are connected to a bit line BL1 (one of bit lines is representatively indicated in FIG. 1).

The source of the cell transistor 11 is connected to one terminal of a capacitor 12, and the other terminal of the capacitor 12 is connected to a capacitor plate potential VPL.

Reference numeral 13 denotes a bit line precharging MOS transistor, and reference symbol PRE denotes a precharge signal. Reference numeral 14 denotes a bit line precharging power supply line, and the reference numeral 15 denotes a second pad connected to the bit line precharging power supply line 14.

Reference symbols A0 to An denote address signal bits. Reference numeral 16 denotes a first address decoder for decoding the address signal bits A0 and A1; 17, a second address decoder for decoding the address signal bits A2 to An; 18, first word line driving circuits selectively driven by an output from the first address decoder 16; and 19, second word line driving circuits selectively driven by an output from the second address decoder 17.

Reference symbols WL01 to WL04 denote word lines each having one end connected to a corresponding one of output nodes of the word line driving circuits 18. The other end of each word line is connected to a corresponding one of second driving voltage source nodes of the word line driving circuits 19. Reference symbols WL1 to WL4 denote word lines each having one end connected to a corresponding one of output nodes of the word line driving circuits 19.

Reference numeral 20 denotes a word line potential boosting circuit, reference symbols BOOT denotes a boost signal, reference numeral 21 denotes a transfer gate MOS transistor connected between the word line potential boosting circuit 20 and first driving voltage source nodes of the word line driving circuits 18, reference numeral 22 denotes a barrier MOS transistor, and the reference symbol FON denotes a transfer gate control signal. The transfer gate control signal FON is activated during a normal operation to turn on the transfer gate transistor 21 and is set in an inactive state during a voltage stress test to turn off the transfer gate transistor 21.

Each of the word line driving circuits 18 and 19 comprises a word line driving MOS transistor 23 connected between a driving voltage source node and a word line, a noise killer MOS transistor 24 connected between a word line and a ground potential (Vss) node, a barrier MOS transistor 25 connected between the output node of an address decoder and the gate of the word line driving transistor 23, and a CMOS inverter 26 connected to the output node of the address decoder and the gate of the noise killer transistor 24.

In addition, one terminal (cathode) of each of PN diodes 27 is connected to a corresponding one of the word lines WL1 to WL4. A voltage applying circuit which simultaneously applies a predetermined voltage to all word lines or an arbitrary number of word lines having the number equal to or larger than the number of word lines selected during a normal operation by controlling the potentials of the other terminal (anode) of each of the diodes 27 is arranged.

In the voltage applying circuit of this embodiment, the anodes of the PN diodes 27 are commonly connected to a first pad 28 which is used in a stress test and which is not used during a normal operation.

Although a stress voltage is applied to the first pad 28 during a voltage stress test, it is preferable that the pad 28 is electrically connected to a Vss potential or an arbitrary negative potential (e.g., a substrate bias potential Vbb) during a normal operation (when a die sort test is performed or when the DRAM is normally used after the DRAM is assembled in a package).

An operation of the DRAM in FIG. 1 will be described below.

In a normal operation, the diodes 27 are set in an OFF state, and the operation of the DRAM is normally performed. In contrast to this, when a burn-in operation is performed in a wafer state, the contact terminal of a tester, e.g., the probe of a probe card, is brought into contact with the first pad 28 to apply a stress voltage thereto, thereby turning on all the diodes 27. For this reason, a voltage stress is applied to the word lines WL1 to WL4, potential defects in a wafer process for the cell transistor 11 can be screened. In this case, no operating power source voltage is applied to the DRAM (a condition Vcc=Vss=0 V is set), and the voltage stress is applied while all the transistors are set in an OFF state. In this state, since the bit lines are set in a floating state, an electric field stress generated by a difference between the word lines and the bit lines may not be sufficient.

The following operation is further effective. That is, a voltage Vcc (e.g., 5 V) is applied to the DRAM as an operating power source voltage, the memory is set in a standby state, and the bit line precharge transistor 13 is turned on, such that a predetermined potential is applied from the second pad 15 to the bit line BL1 through the transistor 13.

In the burn-in state, an external predetermined potential can be applied as a capacitor plate potential VPL, or a capacitor plate potential generating circuit (not shown) can be activated to apply an output potential (normally Vcc/2) of the capacitor plate potential generating circuit.

Figure 2C:
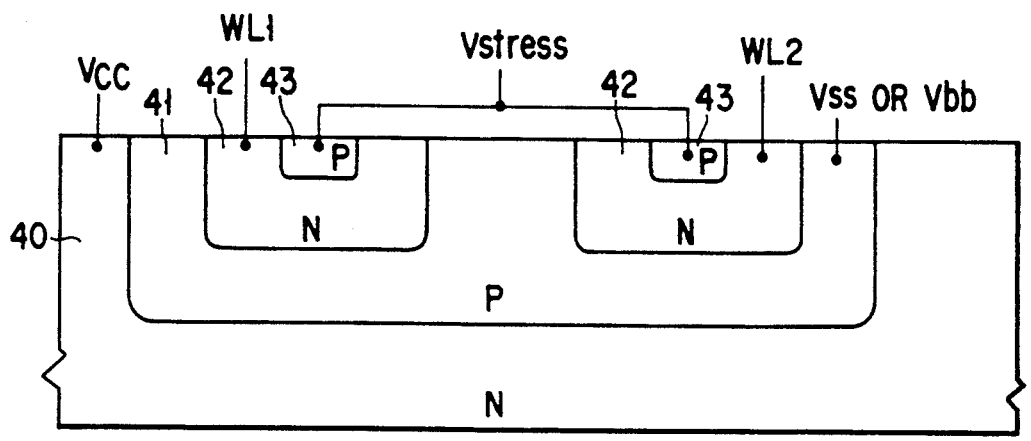

FIGS. 2A to 2C are sectional views showing different arrangements of the PN diodes 27 in FIG. 1.

In FIG. 2A, a first n-type diffusion region 31 is formed on a p-type substrate 30, a p-type diffusion region 32 is formed to be surrounded by the first n-type diffusion region 31, and a plurality of second n-type diffusion regions 33 (the cathode regions of the diodes 27) are formed to be surrounded by the p-type diffusion region 32. The first n-type diffusion region 31 is electrically connected to the p-type diffusion region 32, and this connection point therebetween is to be used as a common anode of the PN diodes 27. The plurality of n-type diffusion regions 33 are connected to different word lines WL1, WL2, respectively.

Since the PN diodes 27 having the above arrangement are used, when a positive stress voltage Vstress is applied to the first pad 28 connected to the common anode, a voltage stress can be simultaneously applied to the plurality of word lines WL1, WL2.

When the ground potential Vss or the negative potential Vbb is applied to the p-type substrate 30, and even when the positive stress voltage Vstress is applied to the common anode, the p-type substrate 30 can be electrically isolated from the p-type diffusion region 32. For this reason, no stress voltage is applied to other MOS transistors arranged in the p-type substrate 30. If a p-type diffusion region is to be formed in the first n-type diffusion region 31, and other MOS transistors are arranged in this region, the p-type diffusion region is formed to be isolated from the p-type diffusion region 32 of the common anode of the PN diodes 27. As a result, the p-type diffusion region can be electrically isolated from the p-type diffusion region 32.

FIGS. 2B and 2C show arrangements of the PN diodes when n-type substrates 40 are used, respectively. In FIG. 2C, reference numeral 41 denotes a p-type diffusion region formed in n-type substrate 40; 42 denotes a plurality of n-type diffusion regions (the cathode regions of the diodes 27) formed to be surrounded by the p-type diffusion region 41; and 43 denotes p-type diffusion regions (the anode regions of the diodes 27) formed to be surrounded by the n-type diffusion regions 42. Other reference numerals in FIG. 2B denote the same parts as in FIG. 2A.

In this arrangement, when the ground potential Vss or the negative potential Vbb is applied to the p-type diffusion region 41, the PN diodes and the n-type substrate 40 can be electrically isolated from each other.

Although various structures, e.g., a structure using an epitaxial wafer, can be used as the structures of the PN diodes, it is preferable in device characteristics to electrically isolate the PN diodes from other elements.

Figure 2D:
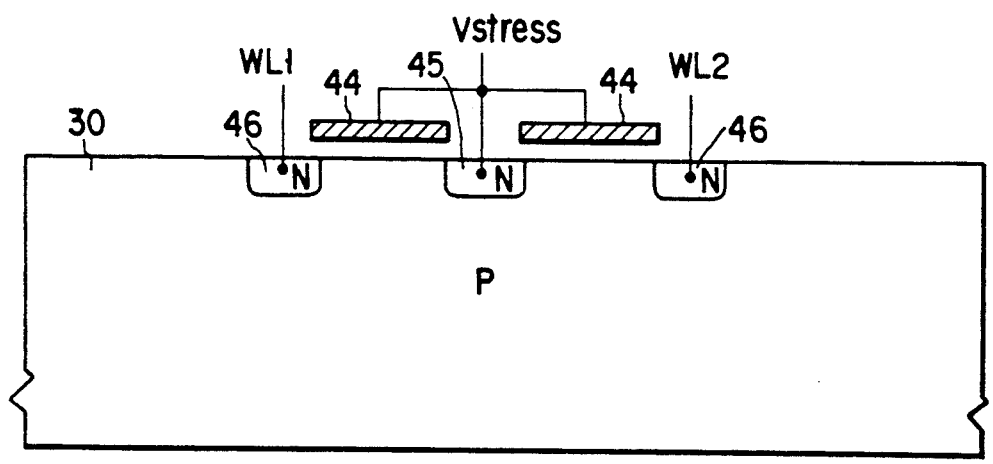

FIG. 2D shows a case wherein a MOS diode is used in place of a PN diode. In the MOS diode, a gate 44 and a source 45 of an n-channel MOS transistor are short-circuited, and a drain 46 is connected to a word line to apply the stress voltage Vstress from the source 45.

When an operating power source voltage is applied to the DRAM in a burn-in state and the DRAM is set in a standby state, since all address signal bits A0 to An are set in "H" level, and the word line driving circuits 18 and 19 select no word line, and the noise killer MOS transistors 24 are turned on. In this state, even when a stress potential is applied from the PN diodes 27 to the word lines, a through current is generated from the ground node through the word lines and the noise killer transistor 24, and a predetermined voltage stress cannot be applied.

In order to prevent the generation of the through current, the voltage stress is preferably applied to the DRAM while all the transistors are set in an OFF state by applying no operating power source voltage to the DRAM. In contrast to this, as described above, when the operating power source voltage is applied to the DRAM in the burn-in operation and the DRAM is set in a standby state, a through-current preventing circuit is additionally arranged to be described later.

Figure 4:
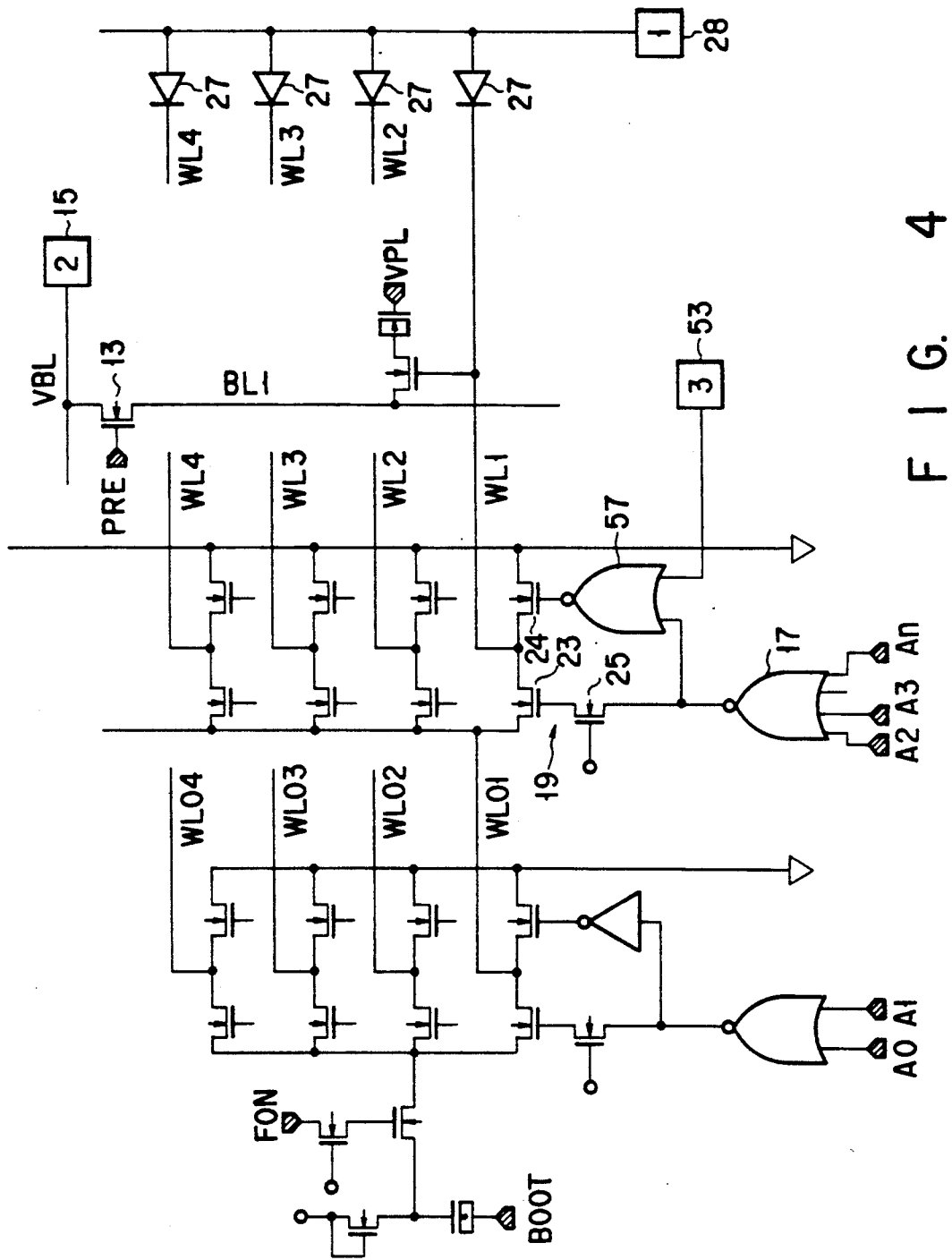
FIG. 4 is a circuit diagram showing a part of a DRAM according to the third embodiment of the present invention.

A first through-current preventing circuit has, as described in FIGS. 3 and 4, a control circuit for turning off the noise killer transistor 24 during a voltage stress test.

In FIG. 3, showing a part of a DRAM according to the second embodiment of the present invention, a control circuit constituted by two-input NAND gates 51 and inverters 52 and a third pad 53 connected to the two-input NAND gates 51 are connected to the input terminals of the address decoders 16 and 17.

With the above arrangement, the address signal bits A0 to An are directly input to the address decoders 16 and 17 such that an "H"-level potential is applied to the third pad 53 in a normal operation state. In contrast to this, in a stress test, outputs from the address decoders 16 and 17 go to "H" level by applying an "L"-level potential to the third pad 53 to set the word line driving circuits 18 and 19 in the word line selecting state, thereby turning off the noise killer transistor 24.

In FIG. 4, showing a part of a DRAM according to the third embodiment of the present invention, a CMOS inverter connected to the input terminal of the noise killer transistor 24 of the word line driving circuit 19 is replaced with a control circuit constituted by a two-input NOR gate 57, and the third pad 53 connected to the two-input NOR gate 57 is arranged.

With the above arrangement, in a normal operating state, the noise killer transistor 24 is controlled in accordance with an output from the address decoder 17 by applying an "L"-level potential to the third pad 53. In contrast to this, in a stress test, an output from the two-input NOR gate 57 goes to "L" level by applying an "H"-level potential to the third pad 53, thereby turning off the noise killer transistor 24.

In the above standby state, a bit line precharge signal generating circuit (not shown) is activated to generate a precharge signal PRE, and the bit line precharging transistor 13 is turned on, thereby applying a predetermined potential to each bit line. At this time, the predetermined voltage can be simultaneously applied to all the bit lines without almost modifying a conventional circuit located around the bit lines. Therefore, when a predetermined voltage (e.g., a ground voltage Vss) is applied to the second pad 15, a predetermined voltage stress can be applied between the word lines and the bit lines, i.e., the gate insulating film of the cell transistor 11.

Even when the second and third pads 15 and 53 are not arranged, a logic circuit for generating a predetermined bit line potential and a control signal may be arranged by using a special input signal sequence and the like.

Figure 5:
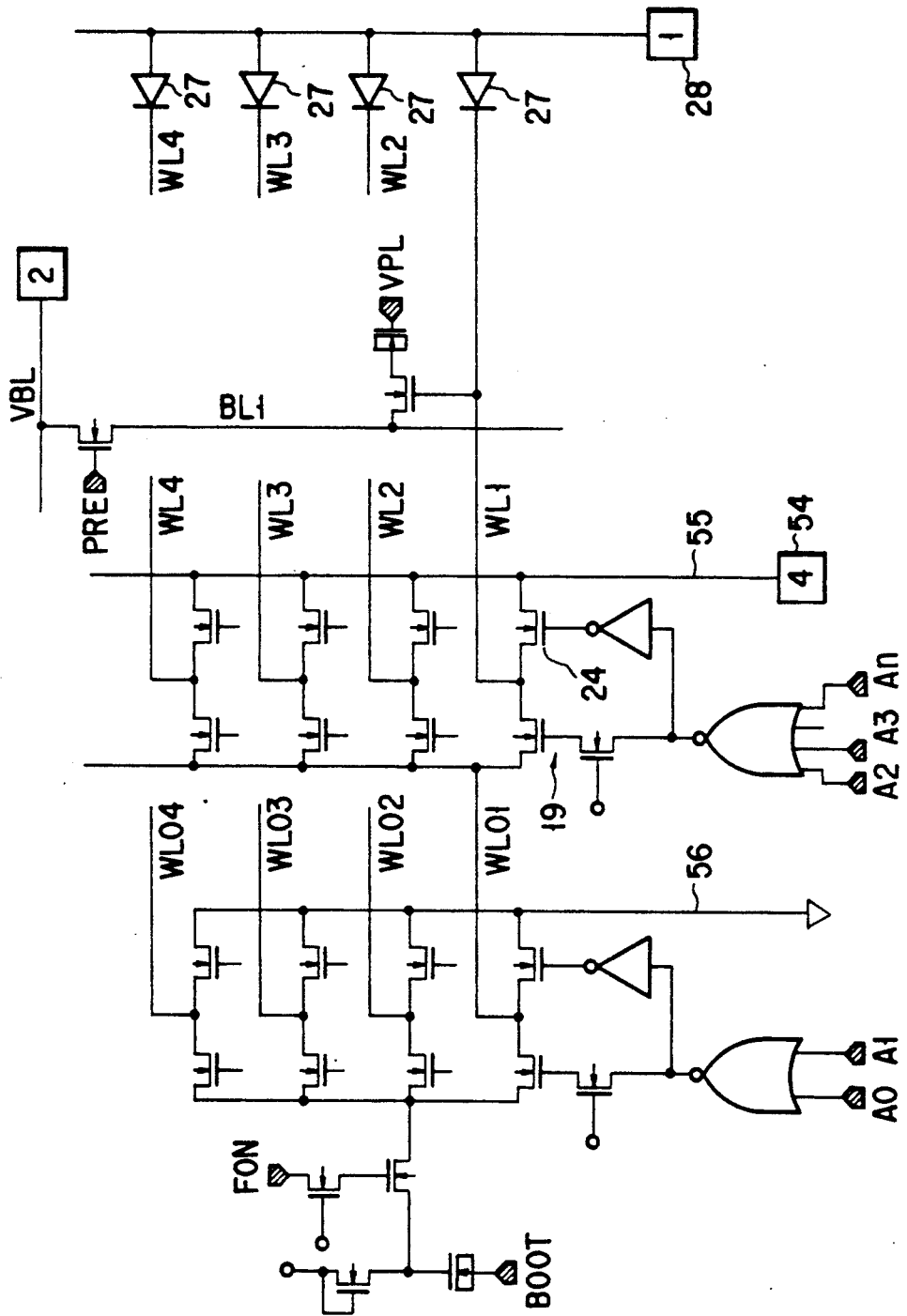
FIG. 5 is a circuit diagram showing a part of a DRAM according to the fourth embodiment of the present invention.

FIG. 5 shows a part of a DRAM according to the fourth embodiment of the present invention.

In the second through-current preventing circuit, the source of the noise killer transistor 24 of the word line driving circuit 19 is connected to a fourth pad 54 through a Vss line 55, and the Vss line 55 is formed to be physically isolated from Vss lines (e.g., a Vss line 56) of other circuits.

In a die sort test or assembly, the fourth pad 54 is electrically connected to the same Vss potential as that of the Vss line 56. In contrast to this, in a voltage stress test, when the fourth pad 54 is set in a floating state (isolated from the other Vss line 56), no through current flows in the noise killer transistor 24.

According to the DRAM in FIGS. 1 and 3 to 5 in a burn-in operation, a demand unique to a DRAM, i.e., a cell transistor having the gate receiving a boosted potential is positively subjected to screening, can be satisfied. Furthermore, in the burn-in operation, a ratio of selected word lines to all word lines is increased, and an efficiency of applying a stress to word lines can be increased to be 1,000 to 2,000 times that of a conventional acceleration method such as a burn-in method. For this reason, a screening efficiency of a cell transistor receiving a boosted potential can be remarkably increased.

Defective transfer gates are figured out in advance before a die sort test, and these transfer gates can be saved by introducing redundancy. In addition, when a time for screening defects after assembly is shortened, a test efficiency can be increased.

Independently of the die sort test, a process for applying a stress for a predetermined time is performed to figure out weak transistors in advance. Thereafter, since no stress is applied during the die sort test, the operation of a tester need not be stopped, and equipment can be efficiently used.

According to the DRAM in FIGS. 1 and 3 to 5 when the probes of a probe card are simultaneously brought into contact with voltage stress testing pads in a chip region on a wafer to apply a voltage stress to the pads during defect screening in a wafer state, the number of voltage stress testing pads with which the probes of the probe card are brought into contact can be decreased per chip. Therefore, when a small number of voltage stress testing pads are required per chip, the following advantages can be obtained.

(a) The number of probes of the probe card is decreased in accordance with the number of pads, and planarity of contact portions between the prove ends and the pads can be easily obtained. When the probe ends of the probe card are to be flattened, the probes of the probe card are not easily damaged, and the durability of the probes are not easily degraded.

(b) The number of probes of the probe card is decreased in accordance with the number of pads, the number of chips with which the probes are simultaneously brought into contact is increased within a maximum number of probes of the probe card which depends on the voltage supply ability of a tester, and a test time is shortened. Therefore, the efficiency of defect screening can be increased.

(c) A distance between pads is set to be a minimum pitch or more of the probes of the probe card, the number of chips with which the probes of the probe card can be simultaneously brought into contact is increased, and a test time is shortened. Therefore, the efficiency of defect screening can be increased.

(d) Since limitations of the arrangement of pads become less strict, pads are arranged to be suitable for simultaneously screening a large number of defects in a wafer state, and the efficiency of screening can be increased.

Figure 6:
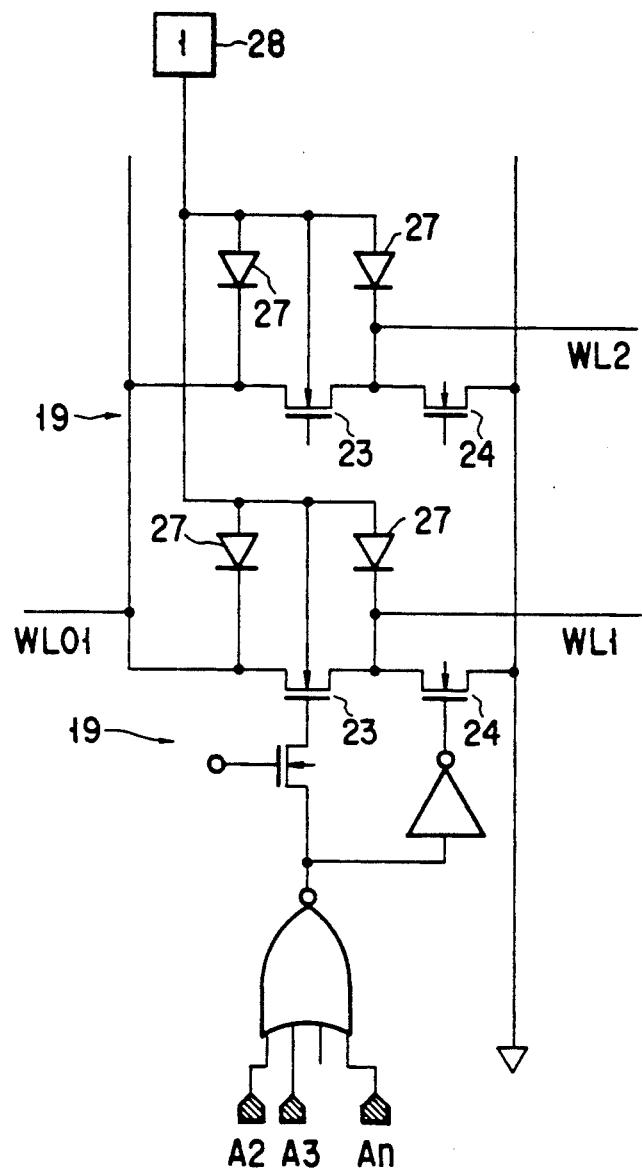
FIG. 6 is a circuit diagram showing a part of a DRAM according to the fifth embodiment of the present invention.

FIG. 6 is a circuit diagram showing a part of a DRAM according to the fifth embodiment of the present invention. This DRAM is different from the DRAM in FIG. 1 in connection points of diodes 27.

In this DRAM, the parasitic PN diodes 27 each of which is formed by a junction between the drain/source (n-type impurity diffusion region) of a word line driving MOS transistor 23 of a word line driving circuit 19 and a substrate (p-type well) are used to simultaneously apply a voltage stress to word lines. In this case, since the p-type well serves as a common anode of the PN diodes 27, this well is formed to be isolated from other p-type wells in which other transistors are formed. In a die sort test or package assembly, the well is electrically connected to a Vss potential or an arbitrary negative Vbb potential through a first pad 28.

As in the DRAM in FIG. 1, according to the DRAM in FIG. 6, a stress potential is preferably applied from the PN diodes 27 while all MOS transistors are set in an OFF state by applying no operation power source voltage to the DRAM.

Figure 7:
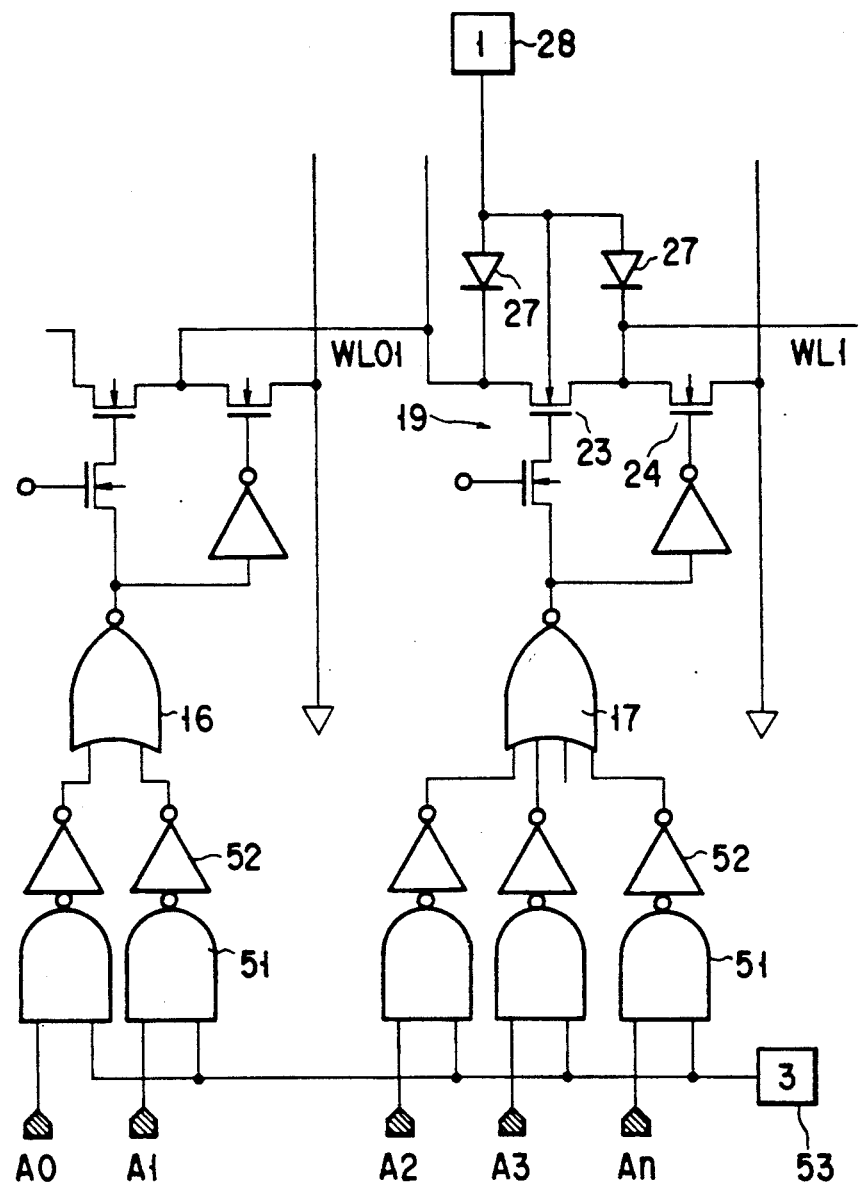
FIG. 7 is a circuit diagram showing a part of a DRAM according to the sixth embodiment of the present invention.
Figure 8:
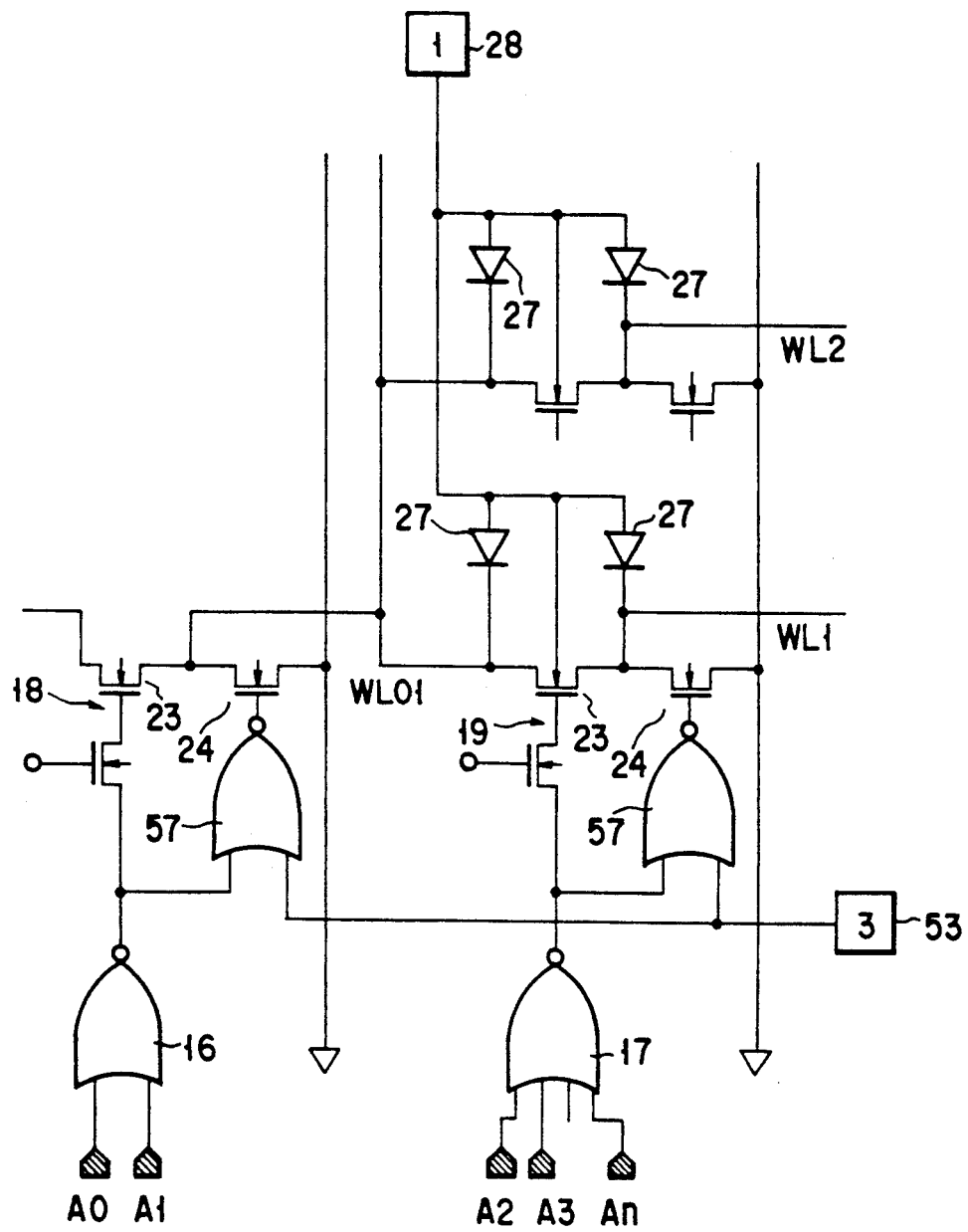
FIG. 8 is a circuit diagram showing a part of a DRAM according to the seventh embodiment of the present invention.

As shown in FIGS. 7, 8, and 9, when a through-current preventing circuit is arranged on the DRAM in FIG. 6, a voltage stress can be applied to word lines in a memory set in a standby state.

In FIG. 7 showing a part of a DRAM according to the sixth embodiment of the present invention, the same through-current preventing circuit as in the DRAM of FIG. 3 is used.

In FIG. 8 showing a part of a DRAM according to the seventh embodiment of the present invention, the same through-current preventing circuit as in the DRAM of FIG. 4 is used. In addition, an output from a two-input NOR gate 16 and an input to a third pad 53 are input to a two-input NOR gate 57, the output node of the NOR gate 57 is connected to the gate of a noise killer transistor 24 of a word line driving circuit 18.

In FIG. 9 showing a part of a DRAM according to the eighth embodiment of the present invention, the same through-current preventing circuit as in the DRAM of FIG. 5 is used. In addition, similar to the source of the noise killer transistor 24 of the word line driving circuit 19, a Vss line 56 connected to the source of the noise killer transistor 24 of the word line driving circuit 18 is formed to be isolated from Vss lines (not shown) of other circuits and connected to a fourth pad 54.

FIG. 10 is a circuit diagram showing a part of a DRAM according to the ninth embodiment of the present invention.

The DRAM in FIG. 10 is different from the DRAM in FIG. 1 in connection positions of diodes 27 and addition of a fourth pad 54.

In this DRAM, the source of a noise killer transistor 24 of a word line driving circuit 19 is connected to a fourth pad 54 through a Vss line 55 formed to be physically isolated from Vss lines (not shown) of other circuits. The parasitic PN diodes 27 each of which is formed by a junction between the drain/source (n-type impurity diffusion region) of the noise killer MOS transistor 24 and a substrate (p-type well) on which the MOS transistor 24 is formed are used to simultaneously apply a voltage stress to word lines.

In this case, since the p-type well serves as a common anode of the PN diodes 27, this p-type well is formed to be isolated from p-type wells in which other transistors are formed. In the die sort test or package assembly, the p-well is electrically connected to a Vss potential or an arbitrary negative Vbb potential through a first pad 28. In the die sort test or package assembly, the fourth pad 54 is grounded (electrically connected to Vss lines of other circuits). However, in a voltage stress test, the fourth pad 54 is set in a floating state. Therefore, in the voltage stress test, a stress voltage can be applied to word lines when a memory is set in a standby state.

If it is preferable to isolate the well from other wells, a word line driving MOS transistor 23 and the noise killer MOS transistor 24 can be formed in the p-type well serving as the common anode of the PN diodes 27 by combining the PN diodes 27 in the DRAM in FIG. 10 and the PN diodes 27 in the DRAM in FIG. 6.

The defect screening performed by applying a voltage stress to all word lines has been described in the above embodiments. According to the above embodiments, when a predetermined stress can be applied to all bit lines, the present invention can also be employed to screening of defects generated between the bit lines, word lines, a cell plate, and the like.

In the above embodiments, although screening of defects caused by an electric field acceleration stress in a DRAM has been exemplified, the present invention can be applied to not only the DRAM but other memory circuits such as a memory integrated circuit and a embedded memory integrated circuit.

For example, when the present invention is applied to an SRAM (Static Random Access Memory), one terminal of each of first diodes is connected to a corresponding one of word lines and one terminal of each of second diodes is connected to a corresponding one of bit lines, a predetermined voltage is simultaneously applied to all word lines (or word lines having the number equal to or larger than that of word lines selected during a normal operation) through the diodes, and a predetermine voltage is simultaneously applied to first or second bit lines of each of all pairs of first and second bit lines (or pairs of bit lines having the number equal to or larger than that of pairs of bit lines selected during a normal operation).

With the above arrangement, a predetermined voltage stress can be efficiently applied to junctions between the gate of one driving transistor (MOS transistor), a data memory storing node (impurity diffusion layer), and a substrate through one transfer gate (MOS transistor) of an SRAM cell.

The present invention can be generally applied to not only a semiconductor memory but a semiconductor device (e.g., Charge Coupled Device; CCD) having common wiring lines connected to one terminal (drain or source) or the gate of each of MOS transistors arranged in the same row or the same column and included in a plurality of MOS transistors arranged in a matrix form.

That is, diodes each having one terminal connected to a corresponding one of common wiring lines of each row or column are arranged, and a voltage applying means for simultaneously applying a predetermined voltage to all the common wiring lines (or the common wiring lines having the number equal to or larger than that of common wiring lines selected during a normal operation) by controlling the potential of the other terminal of each of the diodes is arranged. Therefore, a stress acceleration efficiency for MOS transistors can be increased by using a small number of inputs used for a voltage stress test.

In the above embodiments, a bonding pad may be formed as a terminal exclusively used for a stress test. However, the terminal is not limited to the bonding pad, and any element which can be brought into contact with the contact terminal of a tester used for a burn-in operation in a wafer state can be used. For example, bumps used in the TAB (Tape Automated Bonding) technique may be used.

In the above embodiments, a case wherein pads exclusively used for a stress test are arranged in a chip. However, the following arrangement may be employed. That is, terminals exclusively used for a stress test are arranged in each of an arbitrary number of chip regions of a semiconductor wafer, wiring lines for connecting the terminals to diodes formed in the plurality of corresponding chip regions are formed on, e.g., dicing lines, such that the terminals are commonly used in the arbitrary number of chip regions.

In the above embodiment, although a voltage stress test in a burn-in operation is exemplified, the present invention is effective when a voltage stress test is performed regardless of temperature acceleration.

As described above, the present invention is not limited to the above embodiments described herein and illustrated in the accompanying drawings. Various modification of the present invention may be effected without departing from the spirit or scope of the invention as defined in the appended claims.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
a plurality of MOS transistors arranged in a matrix form of rows and columns, each MOS transistor having a rated voltage characteristic for a normal operation;
a plurality of common wiring lines commonly connected to gates of MOS transistors arranged in the same row or the same column;
a plurality of diodes each having a first terminal and a second terminal, the first terminal of each of said diodes connected to a corresponding one of said common wiring lines, said diodes being formed in a substrate of said semiconductor device to be electrically isolated from said substrate; and
a stress voltage applying means for controlling a potential of the second terminal of each of said diodes and simultaneously applying a stress voltage higher than said rated voltage characteristic to all said common wiring lines or to an arbitrary number of said common wiring lines, wherein the arbitrary number is not less than a number of common wiring lines selected during said normal operation, said stress voltage applying means including a stress test terminal, coupled to said second terminal of each of said diodes, wherein said stress test terminal is connected to a node having one of a ground potential or a predetermined negative potential to thereby prevent forward bias of said plurality of diodes.

2. A semiconductor device comprising:
a plurality of MOS memory cells arranged in a matrix form of rows and columns, each MOS memory cell having a rated voltage characteristic for a normal operation;
a plurality of word lines connected to MOS memory cells of the same row;
a plurality of bit lines connected to MOS memory cells of the same column and including means for supplying a predetermined voltage to said MOS memory cells of the same column during a stress test operation, said predetermined voltage being supplied from an external pad;
a plurality of word line driving circuits connected to said word lines, said word line driving circuits responsive to decoded addresses to thereby select one or more of said word lines during said normal operation;
a plurality of noise-killer transistors connected to said word lines, said noise-killer transistors responsive to said decoded addresses to thereby ground a corresponding one or more of said word lines which are non-selected during said normal operation;
a plurality of diodes each having a first terminal and a second terminal, the first terminal of each of said diodes connected to a corresponding one of said word lines; and
stress voltage applying means for controlling a potential of the second terminal of each of said diodes and simultaneously applying a stress voltage higher than said rated voltage characteristic to all said word lines or to an arbitrary number of said word lines and thereby to a corresponding number of said plurality of MOS memory cells, wherein the arbitrary number is not less than a number of word lines selected during said normal operation.

3. A device according to claim 2, wherein each of said MOS memory cells is a dynamic type memory cell constituted by one transistor and one capacitor.

4. A semiconductor device comprising:
a power supply line and a ground line used for an internal circuit;
a noise-killer transistor having a first terminal and a second terminal;
a word line connected to said first terminal of said noise-killer transistor, said word line including means for applying a predetermined stress voltage to said word line during a voltage stress test; and
a Vss line separate from said power supply line and said ground line, and connected to said second terminal of said noise-killer transistor, said Vss line including means for setting a potential of said Vss line to a floating state during said voltage stress test to thereby prevent operation of said noise-killer transistor, and for setting said potential to a predetermined potential during a normal operation.

5. A semiconductor device comprising:
a plurality of dynamic type MOS memory cells arranged in a matrix of rows and columns, each dynamic type MOS memory cell comprising a transistor and a capacitor;
a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise-killer transistor, wherein each word line driving transistor and noise-killer transistor is connected to one end of a corresponding word line;

a plurality of parasitic PN diodes each having a first terminal connected to a corresponding one of said word lines and a second terminal, each parasitic PN diode formed in a substrate of said semiconductor device and electrically isolated from said substrate and from other elements formed in said substrate, each parasitic PN diode formed by a junction between a region of said semiconductor device having the same conductivity type as said substrate, and an impurity diffusion layer of said word line driving transistor; and stress voltage applying means for controlling a potential of the second terminal of each of said parasitic PN diodes and simultaneously applying a predetermined stress voltage to all said word lines or to an arbitrary number of word lines, wherein the arbitrary number is not less than a number of word lines selected during a normal operation.

6. A semiconductor device comprising:

a plurality of dynamic type MOS memory cells arranged in a matrix of rows and columns, each dynamic type MOS memory cell comprising a transistor and a capacitor;

a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise killer transistor, wherein each word line driving transistor and noise killer transistor is connected to one end of a corresponding word line;

a plurality of parasitic PN diodes each having a first terminal connected to a corresponding one of said word lines and a second terminal, each parasitic PN diode formed in a substrate of said semiconductor device and electrically isolated from said substrate and from other elements formed in said substrate, each parasitic PN diode formed by a junction between a region having the same conductivity type as said substrate, and an impurity diffusion layer of said noise killer transistor; and stress voltage applying means for controlling a potential of the second terminal of each of said parasitic PN diodes and simultaneously applying a predetermined stress voltage to all said word lines or to an arbitrary number of word lines, wherein the arbitrary number is not less than a number of word lines selected during a normal operation.

7. A semiconductor device comprising:

a plurality of dynamic type MOS memory cells arranged in a matrix of rows and columns, each dynamic type MOS memory cell comprising a transistor and a capacitor;

a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise-killer transistor, wherein each word line driving transistor and noise-killer transistor is connected to one end of a corresponding word line;

a plurality of parasitic PN diodes each having a first terminal connected to a corresponding one of said word lines and a second terminal, the plurality of parasitic PN diodes formed in a substrate of said semiconductor device to be electrically isolated from said substrate and from other elements formed in said substrate, and including a first diode type formed by a junction between a region of said semiconductor device having the same conductivity type as said substrate, and an impurity diffusion layer of said word line driving transistor, and a second diode type formed by a junction between a region of said semiconductor device having the same conductivity type as said substrate, and an impurity diffusion layer of said noise killer transistor; and stress voltage applying means for controlling a potential of the second terminal of each of said parasitic PN diodes and simultaneously applying a predetermined stress voltage to all said word lines or to an arbitrary number of word lines, wherein the arbitrary number is not less than a number of word lines selected during a normal operation.

8. A device according to any one of claims 5 to 7, wherein said voltage applying means has a stress test terminal connected to the second terminal of each of said diodes.

9. A device according to claim 8 further comprising a control circuit for setting said noise killer transistor in an OFF state during a voltage stress test.

10. A device according to any one of claims 5 to 7 further comprising a control circuit for setting said noise killer transistor in an OFF state during a voltage stress test.

11. A device according to any one of claims 5 to 7 further comprising a ground line connected to one end of said noise killer transistor and formed to be isolated from ground lines of other circuits.

12. A semiconductor device comprising:

a plurality of dynamic type MOS memory cells arranged in a matrix of rows and columns, each dynamic type MOS memory cell comprising a transistor and a capacitor;

a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise killer transistor, wherein each word line driving transistor and noise killer transistor is connected to a corresponding one of said word lines;

a control circuit for setting each of said noise killer transistors in an OFF state during a voltage stress test;

a plurality of diodes each having a first terminal connected to a corresponding one of said word lines and a second terminal; and stress voltage applying means for controlling a potential of the second terminal of each of said diodes and simultaneously applying a predetermined stress voltage to all said word lines or to an arbitrary number of word lines, wherein the arbitrary number is not less than a number of word lines selected during a normal operation.

13. A semiconductor device comprising:

a plurality of dynamic type MOS memory cells arranged in a matrix of rows and columns, each dynamic type MOS memory cell comprising a transistor and a capacitor;

a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise killer transistor, wherein each word line driving transistor and noise killer transistor is connected to a corresponding one of said word lines;

a control circuit for setting each of said noise killer transistors in an OFF state during a voltage stress test;

a plurality of diodes each having a first terminal connected to a corresponding one of said word lines and a second terminal; and stress voltage applying means for controlling a potential of the second terminal of each of said diodes and simultaneously applying a predetermined stress voltage to all said word lines or to an arbitrary number of word lines, wherein the arbitrary number is not less than a number of word lines selected during a normal operation, said stress voltage applying means including a stress test terminal connected to the second terminal of each of said diodes.

14. A semiconductor device comprising:

a plurality of dynamic type MOS memory cells arranged in a matrix of rows and columns, each dynamic type MOS memory cell comprising a transistor and a capacitor;

a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise killer transistor, wherein each word line driving transistor and noise killer transistor is connected to a corresponding one of said word lines;

a ground line connected to one end of a plurality of said noise killer transistors and formed to be isolated from ground lines of other circuits in said semiconductor device;

a plurality of diodes each having a first terminal connected to a corresponding one of said word lines and a second terminal; and stress voltage applying means for controlling a potential of the second terminal of each of said diodes and simultaneously applying a predetermined stress voltage to all said word lines or to an arbitrary number of word lines, wherein the arbitrary number is not less than a number of word lines selected during a normal operation.

15. A device according to claim 12, 13, or 14 wherein said diodes are formed in a substrate of said semiconductor device to be electrically isolated from said substrate.

16. A device according to claim 15, wherein said diodes are formed to be electrically isolated from other elements.

17. A device according to claim 16, wherein said diodes are formed independently of said word line driving circuits.

18. A device according to claim 12 or 14, wherein said stress voltage applying means includes a stress test terminal connected to the second terminal of each of said diodes.

19. A device according to claim 18, wherein said stress test terminal is connected to a node having one of a ground potential or a predetermined negative potential to thereby prevent forward bias of said plurality of diodes.

20. A semiconductor device comprising:

a plurality of dynamic type MOS memory cells arranged in a matrix of rows and columns, each dynamic type MOS memory cell comprising a transistor and a capacitor;

a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise-killer transistor, wherein each word line driving transistor and noise-killer transistor is connected to one end of a corresponding word line;

a plurality of MOS diodes each having a first terminal connected to a corresponding one of said word lines and a second terminal, a first terminal side of each said MOS diode formed from a drain of a MOS transistor formed in a substrate of said semiconductor device, and a second terminal side of each said MOS diode formed from shorted gate and source terminals of said MOS transistor; and stress voltage applying means for controlling a potential of the second terminal of each of said MOS diodes and simultaneously applying a predetermined stress voltage to all said word lines or to an arbitrary number of word lines, wherein the arbitrary number is not less than a number of word lines selected during a normal operation.

21. A semiconductor device comprising:

a plurality of dynamic type MOS memory cells arranged in a matrix of rows and columns, each dynamic type MOS memory cell comprising a transistor and a capacitor;

a plurality of word lines each connected to dynamic type MOS memory cells of one row;

a plurality of bit lines each connected to dynamic type MOS memory cells of one column;

a plurality of word line driving circuits connected to said word lines, said word line driving circuits responsive to decoded addresses to thereby select one or more of said word lines, each word line driving circuit comprising a word line driving transistor and a noise-killer transistor, wherein each word line driving transistor and noise-killer transistor is connected to one end of a corresponding word line;

a plurality of parasitic PN diodes each having a first terminal connected to a corresponding one of said word lines and a second terminal, each parasitic PN diode formed in a substrate of said semiconductor device and electrically isolated from said substrate and from other elements formed in said substrate, each parasitic PN diode formed by a junction between a region of said semiconductor device having a different conductivity type from said substrate, and an impurity diffusion layer of said word line driving transistor; and stress voltage applying means for controlling a potential of the second terminal of each of said parasitic PN diodes and simultaneously applying a predetermined stress voltage to all said word lines or to an arbitrary number of word lines, wherein the arbitrary number is not less than a number of word lines selected during a normal operation.

* * * * *